(12) United States Patent
Sun

(10) Patent No.: US 7,872,484 B2
(45) Date of Patent: Jan. 18, 2011

(54) CHIP PIN TEST APPARATUS

(75) Inventor: Zheng-Heng Sun, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/475,510

(22) Filed: May 30, 2009

(65) Prior Publication Data

US 2010/0277194 A1    Nov. 4, 2010

(30) Foreign Application Priority Data

Apr. 30, 2009    (CN) .................. 2009 1 0301996

(51) Int. Cl.
*G01R 31/28* (2006.01)
(52) U.S. Cl. .................................. 324/754.09
(58) Field of Classification Search .............. 324/158.1, 324/754–762
See application file for complete search history.

(56) References Cited

U.S. PATENT DOCUMENTS

| | | | | |
|---|---|---|---|---|
| 6,285,200 B1 * | 9/2001 | Pace et al. | .................. | 324/753 |
| 6,384,377 B1 * | 5/2002 | Komuro | .................. | 219/209 |
| 6,703,851 B1 * | 3/2004 | Howell | .................. | 324/754 |
| 6,879,173 B2 * | 4/2005 | Barr et al. | .................. | 324/763 |
| 2007/0057683 A1 * | 3/2007 | Abe | .................. | 324/754 |

* cited by examiner

*Primary Examiner*—Ha Tran T Nguyen
*Assistant Examiner*—Joshua Benitez
(74) *Attorney, Agent, or Firm*—Zhigang Ma

(57) ABSTRACT

A test apparatus includes a printed circuit board, a chip carrier socket, and a display circuit. The chip carrier socket includes a space to receive a chip including a plurality of pins, a plurality of contact terminals, and a grounded ground portion. The display circuit includes a power supply and a plurality of light-emitting elements. When the chip is received in the space, the ground portion contacts a middle portion of each pin. When a pin of the chip is normal, a distal end of the normal pin contacts a corresponding contact terminal to connect a corresponding light-emitting element to the ground portion, causing the light-emitting element to light up. When a pin of the chip is askew, a distal end of the askew pin cannot contact a corresponding contact terminal, the corresponding light-emitting element will not light up.

20 Claims, 4 Drawing Sheets

CHIP PIN TEST APPARATUS

BACKGROUND

1. Technical Field

The present disclosure relates to test apparatuses, and particularly to a test apparatus to test whether pins of a chip are askew.

2. Description of Related Art

Generally, there are several means for mounting a chip onto a printed circuit board, such as, releasably securing the chip to a chip carrier socket which is soldered on the printed circuit board. Although this method is convenient for removing the chip when needed, it is easy to bend the pins of the chip. When a pin or pins of the chip are askew, the pins may not properly engage in the chip carrier socket, and the chip will not work normally. Although the pins can be straightened as needed, it is difficult for an operator to distinguish which pin or pins are skewed by sight.

DETAILED DESCRIPTION

Figure 1:
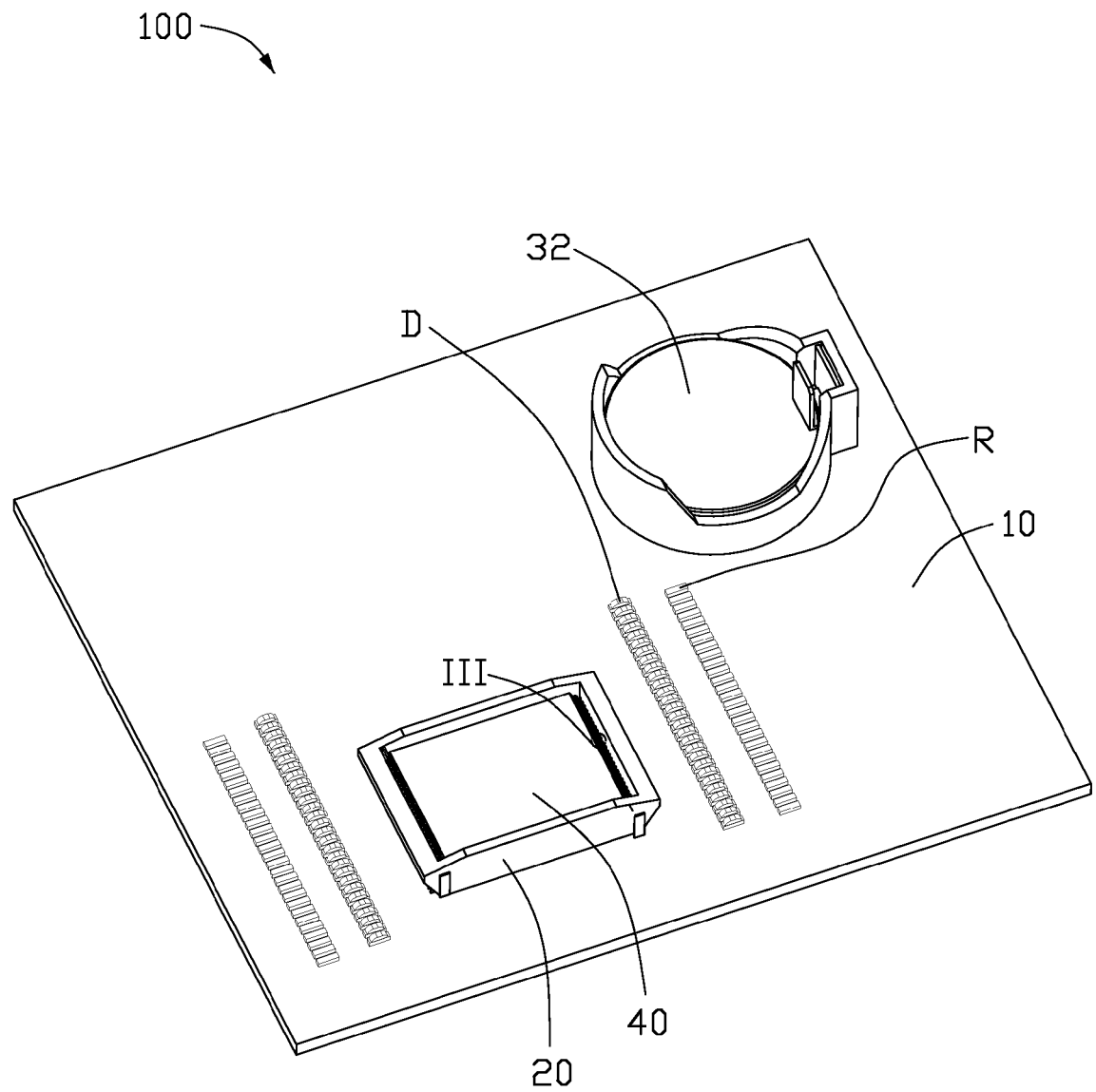
FIG. 1 is a schematic, isometric view of an embodiment of a test apparatus, the test apparatus including a chip carrier socket.
Figure 2:
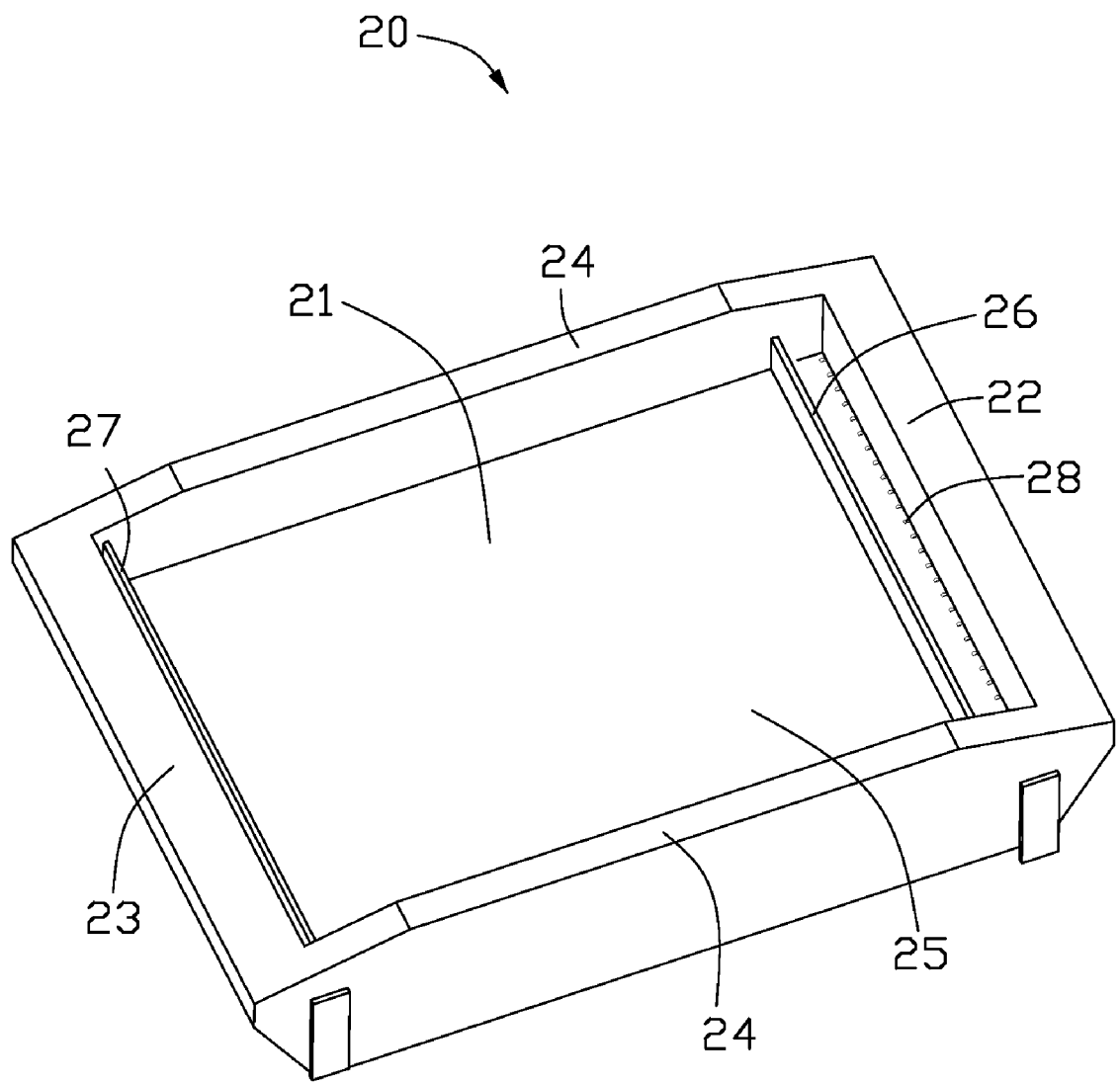
FIG. 2 is an enlarged, isometric view of the chip carrier socket of the test apparatus of FIG. 1.
Figure 3:
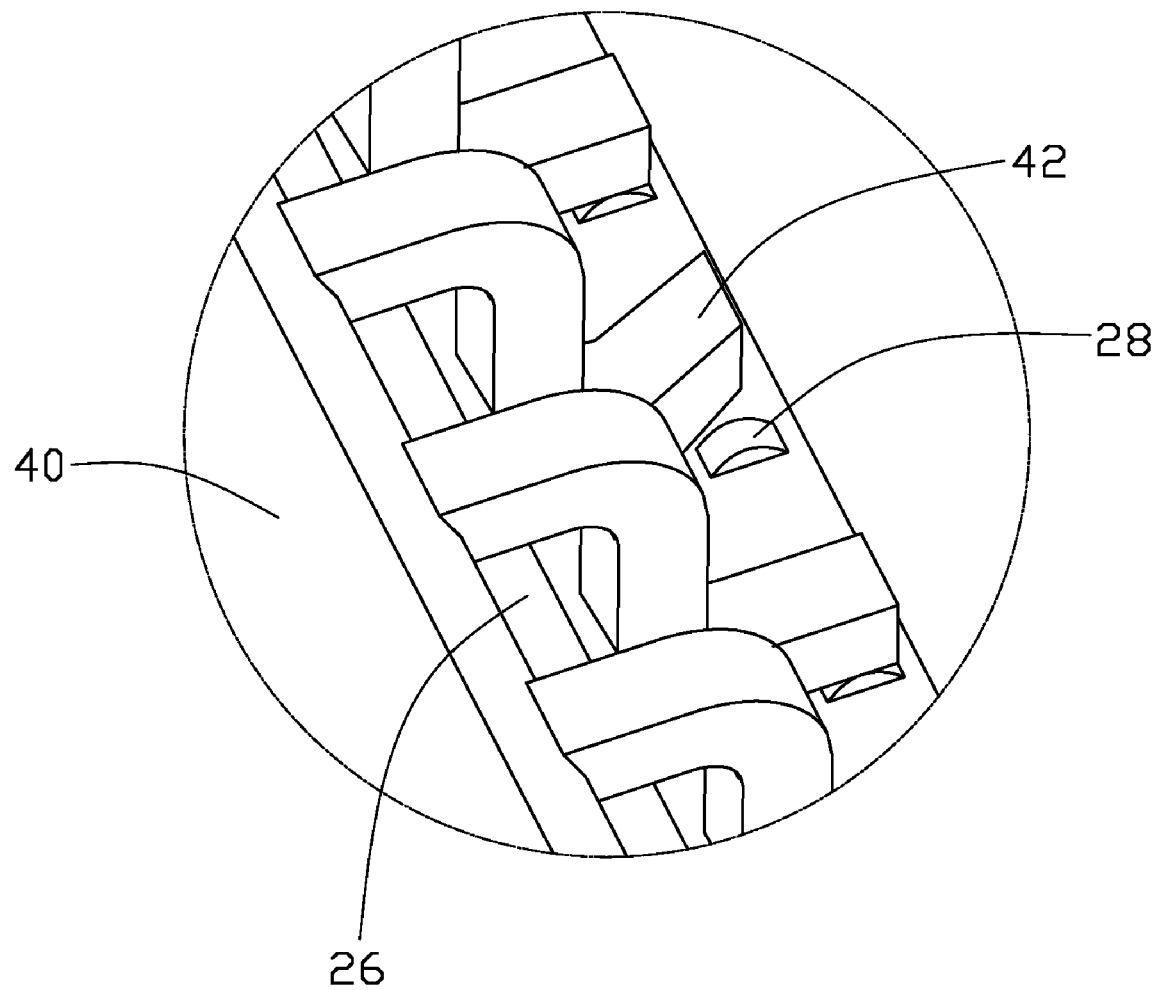
FIG. 3 is an enlarged view of the circled portion III of FIG. 1.
Figure 4:
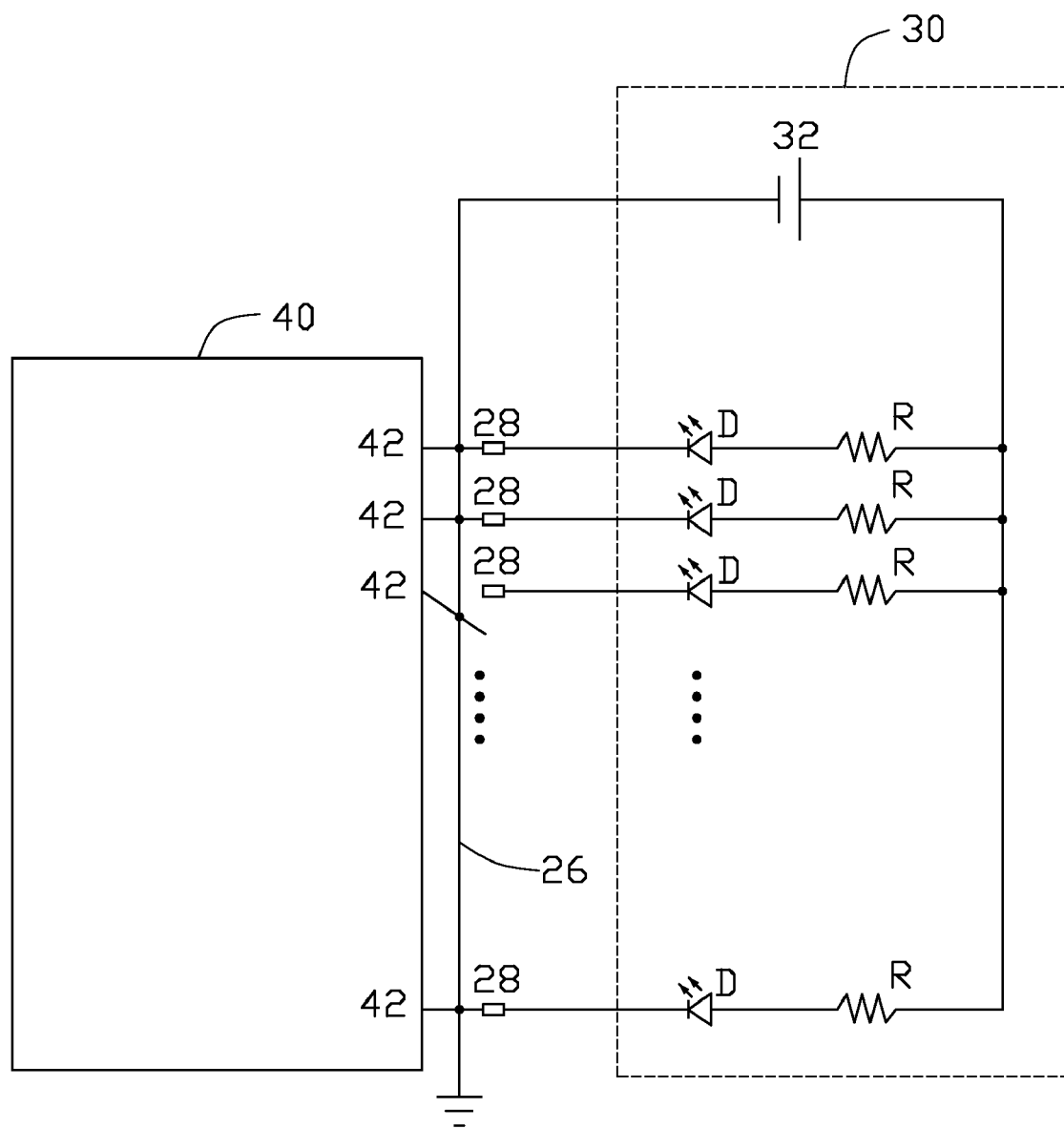
FIG. 4 is circuit diagram of the test apparatus of FIG. 1.

Referring to FIGS. 1 to 4, an exemplary embodiment of a test apparatus 100 includes a printed circuit board (PCB) 10, a display circuit 30 mounted on the PCB 10, and a chip carrier socket 20 mounted on the PCB 10 and electronically connected to the display circuit 30. The chip carrier socket 20 is to receive a chip 40, such as an integrated circuit. The chip 40 includes two groups of pins 42 located at opposite sides of the chip 40. Each of one group of pins 42 is substantially Z-shaped, and includes a first portion extending out from one of the opposite sides of the chip 40, a second portion extending down from a distal end of the first portion, and a third portion extending out from a bottom end of the second portion. Each of the other group of pins 42 is substantially Z-shaped, and includes a fourth portion extending out from the other one of the opposite sides of the chip 40, a fifth portion extending down from a distal end of the fourth portion, and a sixth portion extending out from a bottom end of the fifth portion. The display circuit 30 is to indicate which pin(s) of the chip 40 is askew.

In one embodiment, the chip carrier socket 20 includes a bottom wall 21, a front wall 22 perpendicularly extending up from a front end of the bottom wall 21, a back wall 23 perpendicularly extending up from a rear end of the bottom wall 21, and two sidewalls 24 perpendicularly extending up from opposite sides of the bottom wall 21. The bottom wall 21, the front wall 22, the back wall 23, and the sidewalls 24 cooperate to define a space 25 to receive the chip 40. A first ground portion 26 is positioned in the space 25 adjacent to the front wall 22. Two ends of the first ground portion 26 pass through the sidewalls 24 respectively, and are mounted on the PCB 10 to be electronically grounded. A second ground portion 27 is positioned in the space 25, adjacent to the back wall 23. Two ends of the second ground portion 27 pass through the sidewalls 24 respectively, and are mounted on the PCB 10 to be electronically grounded. A plurality of contact terminals 28 pass through the bottom wall 21, and are arrayed in line between each of the back wall 23 and the front wall 23, and the corresponding one of the first and second ground portions 26, 27. Each of the plurality of contact terminals 28 is electronically connected to the display circuit 30, and is apart from a corresponding one of the first and second ground portions 26, 27 at a certain distance. In one embodiment, the distance is no more than a horizontal length of a pin 42 of the chip 40.

The display circuit 30 includes a power supply 32, a plurality of light-emitting elements, such as a plurality of light-emitting diodes D, and a plurality of resistors R. An anode of each light-emitting diode D is connected to a power terminal of the power supply 32 via a resistor R, a cathode of each light-emitting diode D is electronically connected to a corresponding contact terminal 28. A ground terminal of the power supply 32 is electronically connected to the first ground portion 26 and the second ground portion 27. In one embodiment, the power supply 32 is a button battery mounted on the PCB 10.

In use, the chip 40 is received in the space 25, the two groups of pins 42 contact the first ground portion 26 and the second ground portion 27 respectively. In one embodiment, the one group of pins 42 contacting the first ground portion 26 are taken as an example to illustrate a testing process. When the chip 40 is received in the space 25, the ground portion 26 is located between the one of the opposite sides of the chip 40 and the second portions of the one group of pins 42, with a top portion of the ground portion 26 contacting the first portions of the one group of pins 42. When a pin 42 of the one group is normal (e.g., not askew), a distal end of the normal pin 42 contacts a corresponding contact terminal 28, therefore, the corresponding contact terminal 28 is connected to the first ground portion 26 via the normal pin 42, and a light-emitting diode D connected to the contact terminal 28 corresponding to the normal pin 42 lights up. When a pin 42 of the one group is askew, a distal end of the askew pin 42 cannot contact a corresponding contact terminal 28, therefore, the corresponding contact terminal 28 cannot connect to the first ground portion 26, and the light-emitting diode D connected to the contact terminal 28 corresponding to the askew pin 42 does not light up. In summary, the light-emitting diode D indicates whether a corresponding pin 42 is in a normal position, that is, if the light-emitting diode D lights up, the corresponding pin 42 is normal, otherwise, the corresponding pin 42 is askew, and needs to be repaired. After askew pins of the chip 40 are repaired, the chip 40 can be installed normally.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A test apparatus, comprising:
   a printed circuit board;
   a chip carrier socket mounted on the printed circuit board and defining a space to receive a chip comprising a plurality of pins, wherein the chip carrier socket comprises a plurality of contact terminals corresponding to the pins of the chip, and a ground portion being grounded via the printed circuit board; and a display circuit mounted on the printed circuit board, the display circuit for indicating the results of a chip test conducted by the apparatus, wherein the display circuit comprises:
  a power supply comprising a power terminal and a ground terminal; and
  a plurality of light-emitting elements, wherein each light-emitting element is connected between the power terminal of the power supply and a corresponding contact terminal;
wherein the ground portion contacts a portion of each pin of the chip, when the chip is received in the space;
wherein when the chip is received in the space, if a corresponding contact terminal contacts a distal end of the pin grounded via the grounded portion, a light-emitting element connected to the contact terminal and corresponding to the tested pin lights up; and
wherein when the chip is received in the space, if a distal end of a pin cannot contact a corresponding contact terminal to ground the corresponding contact terminal through the grounded portion, a light-emitting element connected to the corresponding contact terminal does not light up.

2. The test apparatus of claim 1, wherein each light-emitting element is a light-emitting diode.

3. The test apparatus of claim 1, wherein the chip carrier socket further comprises a bottom wall, a front wall perpendicularly extending up from a front end of the bottom wall, a back wall perpendicularly extending up from a rear end of the bottom wall, and two sidewalls perpendicularly extending up from opposite sides of the bottom wall, the front wall, rear wall, and sidewalls bound the space.

4. The test apparatus of claim 3, wherein the ground portion is positioned in the space adjacent to the front wall, two ends of the ground portion pass through the sidewalls respectively, and are mounted on the printed circuit board to be electronically grounded.

5. The test apparatus of claim 3, wherein the plurality of contact terminals pass through the bottom wall from the space, and arrayed in line between the front wall and the ground portion, each contact terminal is apart from the ground portion in a certain distance.

6. The test apparatus of claim 5, wherein the distance is no more than a horizontal length of each pin of the chip.

7. The test apparatus of claim 1, wherein the power supply is a button battery mounted on the printed circuit board.

8. A test apparatus, comprising:
a chip carrier socket mounted onto a printed circuit board and defining a space to receive a chip comprising a plurality of pins, wherein the chip carrier socket comprises a plurality of contact terminals corresponding to the pins of the chip, a ground portion; and
a display circuit mounted on the printed circuit board, the display circuit for indicating the results of a chip test conducted by the apparatus, wherein the display circuit comprises a plurality of light-emitting elements, each light-emitting element is connected between a power terminal of a power supply and a corresponding contact terminal;
wherein the ground portion contacts a portion of each pin of the chip, when the chip is received in the space;
wherein when the chip is received in the space, if a corresponding contact terminal contacts a distal end of the pin grounded via the grounded portion, a light-emitting element connected to the contact terminal and corresponding to the tested pin lights up; and
wherein when the chip is received in the space, if a distal end of a pin cannot contact a corresponding contact terminal to ground the corresponding contact terminal through the grounded portion, a light-emitting element connected to the corresponding contact terminal does not light up.

9. The test apparatus of claim 8, wherein each light-emitting element is a light-emitting diode.

10. The test apparatus of claim 8, wherein the chip carrier socket further comprises a bottom wall, a front wall perpendicularly extending up from a front end of the bottom wall, a back wall perpendicularly extending up from a rear end of the bottom wall, and two sidewalls perpendicularly extending up from opposite sides of the bottom wall, the front wall, rear wall, and sidewalls bound the space.

11. The test apparatus of claim 10, wherein the ground portion is positioned in the space adjacent to the front wall, two ends of the ground portion pass through the sidewalls respectively, and are mounted on the printed circuit board to be electronically grounded.

12. The test apparatus of claim 10, wherein the plurality of contact terminals pass through the bottom wall from the space, and arrayed in line between the front wall and the ground portion, each contact terminal is apart from the ground portion in a certain distance.

13. The test apparatus of claim 12, wherein the distance is no more than a horizontal length of each pin of the chip.

14. A method for testing chip pins, comprising:
providing a chip carrier socket mounted onto a printed circuit board, wherein the chip carrier socket comprises a space to receive a chip comprising a plurality of pins, a plurality of contact terminals corresponding to the pins of the chip, and a ground portion; and
providing a display circuit to indicate the results of a chip test conducted by the apparatus, wherein the display circuit comprises a plurality of light-emitting elements, each light-emitting element is connected between a power terminal of a power supply and a corresponding contact terminal;
wherein the ground portion contacts a portion of each pin of the chip, when the chip is received in the space;
wherein when the chip is received in the space, if a corresponding contact terminal contacts a distal end of the pin grounded via the grounded portion, a light-emitting element connected to the contact terminal and corresponding to the tested pin lights up; and
wherein when the chip is received in the space, if a distal end of a pin cannot contact a corresponding contact terminal to ground the corresponding contact terminal through the grounded portion, a light-emitting element connected to the corresponding contact terminal does not light up.

15. The method of claim 14, wherein each light-emitting element is a light-emitting diode.

16. The method of claim 14, wherein the chip carrier socket further comprises a bottom wall, a front wall perpendicularly extending up from a front end of the bottom wall, a back wall perpendicularly extending up from a rear end of the bottom wall, and two sidewalls perpendicularly extending up from opposite sides of the bottom wall, the front wall, rear wall, and sidewalls bound the space.

17. The method of claim 16, wherein the ground portion is positioned in the space adjacent to the front wall, two ends of the ground portion pass through the sidewalls respectively, and are mounted on the printed circuit board to be electronically grounded.

18. The method of claim 16, wherein the plurality of contact terminals pass through the bottom wall from the space, and arrayed in line between the front wall and the ground portion, each contact terminal is apart from the ground portion in a certain distance.

19. The method of claim 18, wherein the distance is no more than a horizontal length of each pin of the chip.

20. The test apparatus of claim 1, wherein each of the pins of the chip is substantially Z-shaped, comprising a first portion extending out from a side of the chip, a second portion extending down from a distal end of the first portion, and a third portion extending out from a bottom end of the second portion; and wherein when the chip is received in the space of the chip carrier socket, the ground portion of the chip carrier socket is located between the side of the chip and the second portions of the pins with a top portion of the ground portion contacting the first portions of the pins.

* * * * *